(12) United States Patent
Hsiung

(10) Patent No.: US 6,720,737 B1
(45) Date of Patent: Apr. 13, 2004

(54) LED ILLUMINATION STRUCTURE

(76) Inventor: Bear Hsiung, 5F, No. 30, Lane 179, Sec. 2, Nei Hu Rd., Nei-Hu, Taipei (TW)

( * ) Notice: Subject to any disclaimer, the term of this patent is extended or adjusted under 35 U.S.C. 154(b) by 0 days.

(21) Appl. No.: 10/431,371

(22) Filed: May 8, 2003

(51) Int. Cl.[7] .......................... H05B 37/00; H01L 27/14
(52) U.S. Cl. ................. 315/185 S; 362/800; 362/806; 362/812
(58) Field of Search .................. 315/185 S, 169.1, 315/169.3; 362/800, 806, 812

(56) References Cited

U.S. PATENT DOCUMENTS 6,604,880 B1 * 8/2003 Huang et al. ............... 401/195

* cited by examiner

*Primary Examiner*—Tuyet T. Vo
(74) *Attorney, Agent, or Firm*—Browdy and Neimark, P.L.L.C.

(57) ABSTRACT

A light emitting diode (LED) illumination structure has a button-sized battery, a circuit board, an LED chip and a contact switch. A positive electrode of the LED chip electrically connects to a positive electrode of the button-sized battery, and a negative electrode of the LED chip electrically connects to the circuit board via a conductive wire. A transparent molding material encapsulates the LED chip and the conductive wire. One terminal of the contact switch electrically connects to the circuit board while the other terminal connects to a negative electrode of the button-sized battery. Direct attachment of the positive electrode of the LED chip to the positive electrode of the button-sized battery provides electrical connection and heat dissipation from the LED chip through the button-sized battery to stabilize the high brightness characteristic. The LED illumination structure is thereby constructed with a reduced size.

8 Claims, 3 Drawing Sheets

LED ILLUMINATION STRUCTURE

BACKGROUND OF THE INVENTION

1. Field of the Invention

The invention relates to an LED illumination structure. More particularly, the invention relates to an LED illumination structure including a button-sized battery.

2. Description of the Related Art

The use of an ornament may substantially contribute to improve the aesthetic aspect of manufactured products. The combination of a traditional design integrated within an electronic product becomes a mainstream for the ornament industry. In addition to a low production cost and an increased quality, the factors of small size and a pleasant aesthetic aspect often plays an important role in the commercial success of an ornament product. For a very bright electric illumination device, the heat dissipation further is a critical issue to the performance of the product.

As illustrated in FIG. 1, a conventional LED illumination structure mounted in an ornament includes a button-sized battery 1, a conductive sheet 2, an LED 3 and a vibration switch 4. A negative lead 30 of the LED 3 is soldered into the conductive sheet 2 that is electrically connected to a negative electrode of the button-sized battery 1. A positive lead 31 of the LED 3 is soldered onto a metallic casing 5 of the ornament and electrically connected to a positive electrode of the button-sized battery 1 via the vibration switch 4.

In the above LED illumination structure, the negative lead 30 of the LED 3 must be inserted into the conductive sheet 2 and the positive lead 31 must extend to contact the metallic casing 5 to ensure the electrical connection of the LED 3 to the button-sized battery 1. Such a structure occupies a certain space, complicates its assembly, and increases the failure rate of soldering. Therefore, the conventional LED illumination structure is only suitable for limited applications due to its size. Furthermore, the LED 3 is not bright, which makes it disadvantageous as a light source in ornament products.

SUMMARY OF THE INVENTION

It is therefore an object of the invention to provide an LED illumination structure that is very bright, small, and easily mass produced.

In order to achieve the above and other objectives, an LED illumination structure of the invention comprises a button-sized battery, a circuit board, an LED chip and a contact switch. The circuit board is attached on a positive electrode of the button-sized battery. A positive electrode of the LED chip is electrically connected to a positive electrode of the button-sized battery, and a negative electrode of the LED chip is electrically connected to the circuit board via a conductive wire. A transparent molding material encapsulates the LED chip and the conductive wire. One terminal of the contact switch is electrically connected to the circuit board and the other terminal thereof is electrically connected to a negative electrode of the button-sized battery.

Direct attachment of the positive electrode of the LED chip on the positive electrode of the button-sized battery provides electrical connection and further enables heat dissipation from the LED chip through the button-sized battery to stabilize the high brightness characteristic of the LED illumination structure. The negative electrode of the LED chip is electrically connected to the neighboring circuit board and then encapsulated within the molding material. The LED illumination structure is thereby produced with a reduced size.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
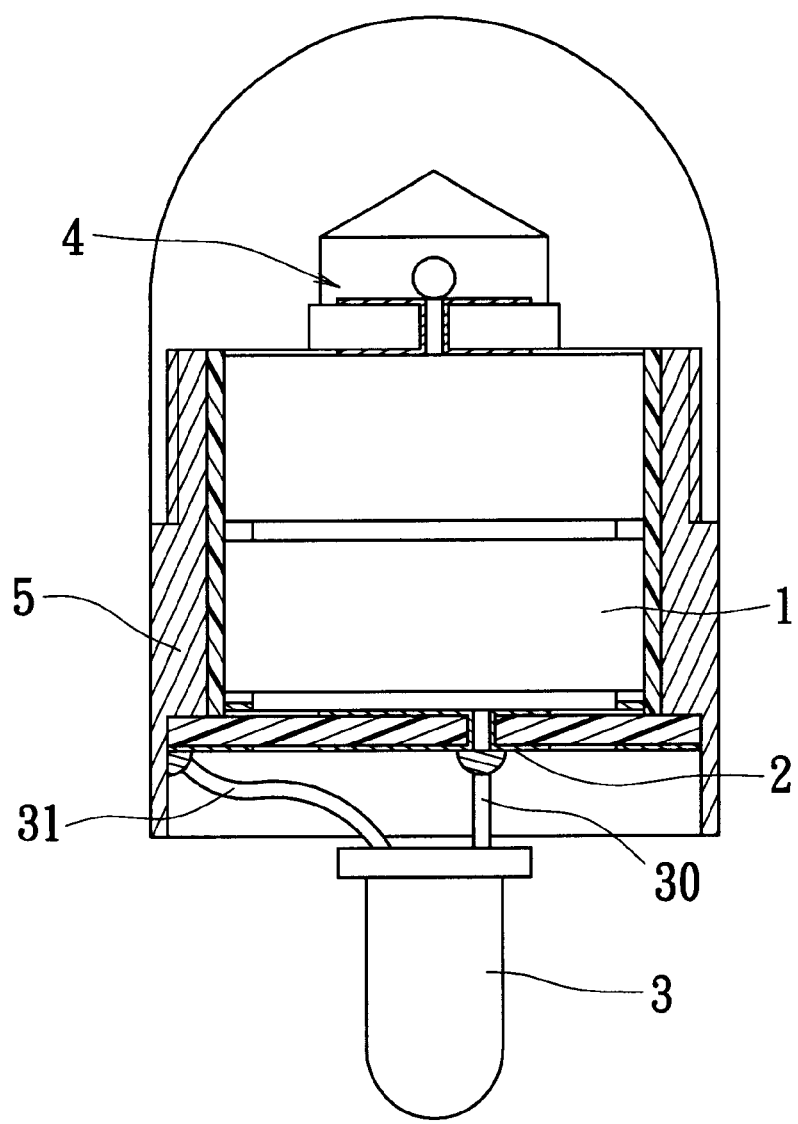
FIG. 1 is a schematic view of a conventional LED illumination structure.

Wherever possible in the following description, like reference numerals will refer to like elements and parts unless otherwise illustrated.

Figure 2:
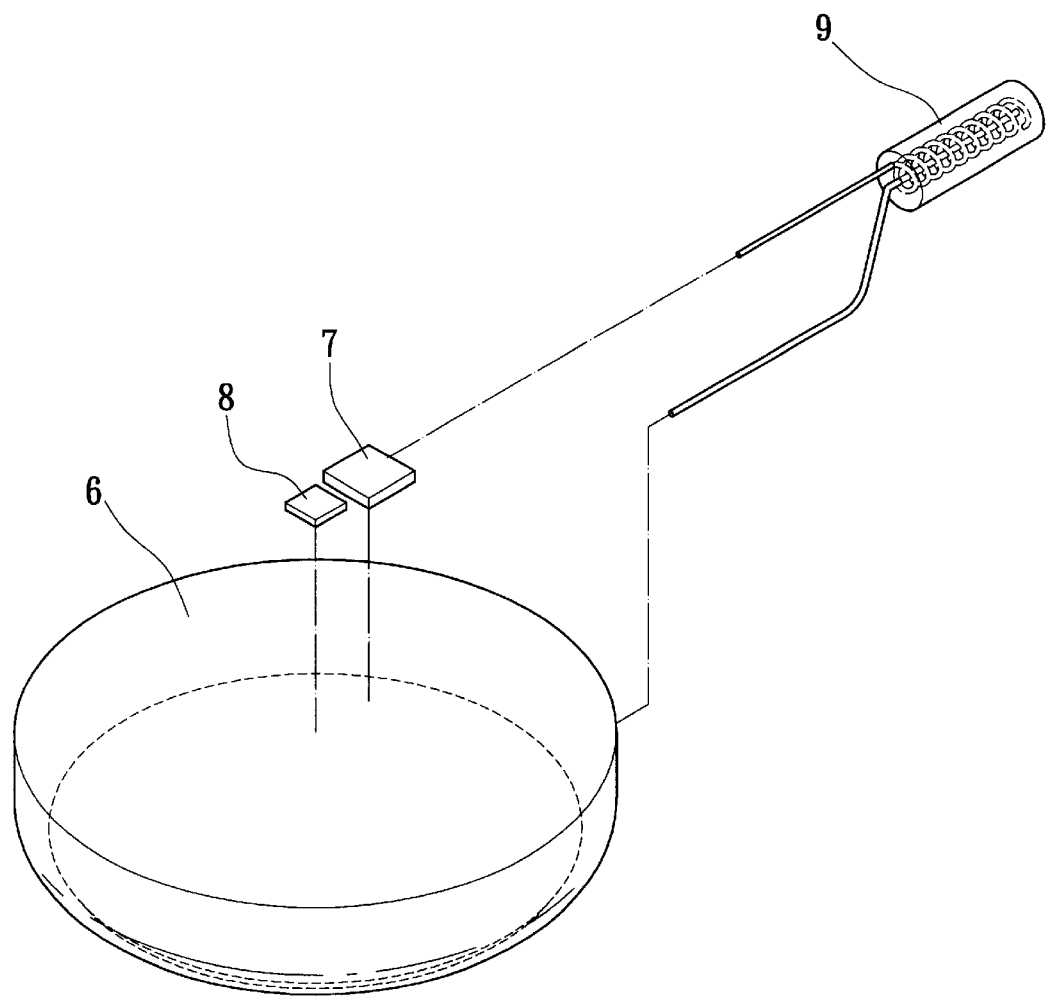
FIG. 2 is an exploded view of an LED illumination structure according to one embodiment of the invention.
Figure 3:
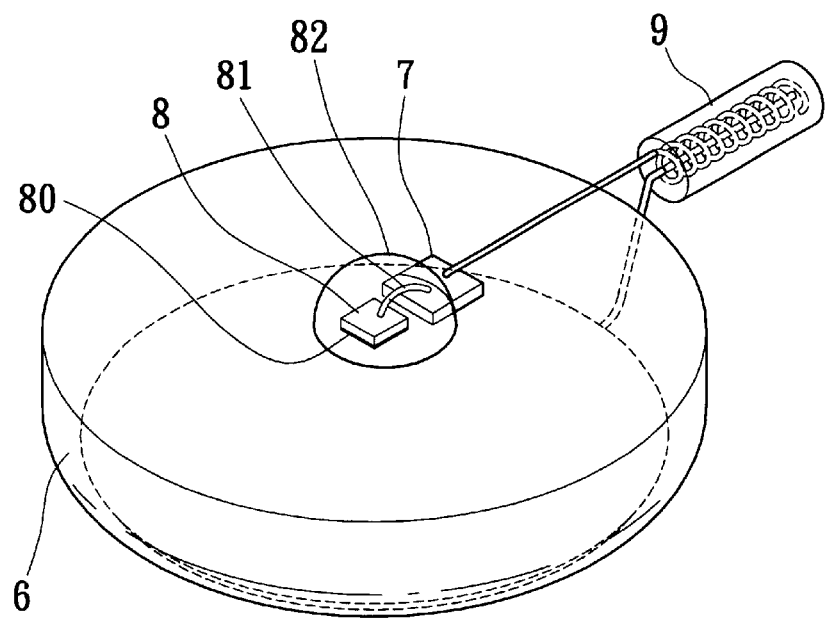
FIG. 3 is a perspective view of an LED illumination structure according to one embodiment of the invention.
Figure 4:
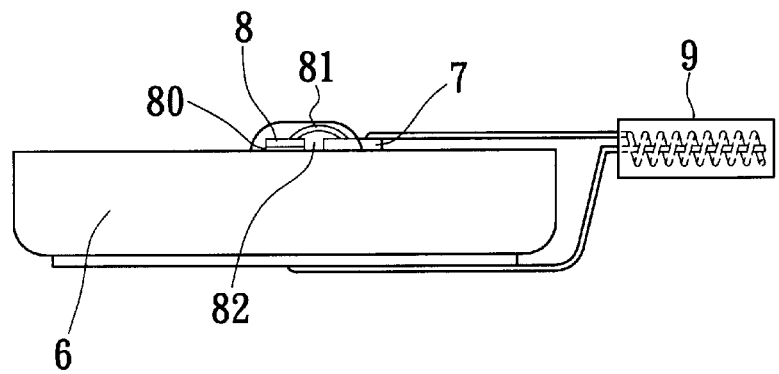
FIG. 4 is a cross-sectional view of an LED illumination structure according to one embodiment of the invention.

Referring to FIG. 2 to FIG. 4, the invention provides an LED illumination structure including a button-sized battery 6, a circuit board 7, an LED chip 8 and a contact switch 9.

The button-sized battery 6 is, for example, a silver oxide battery, alkaline battery or a lithium battery.

The circuit board 7 is attached on a positive electrode of the button-sized battery 6.

The LED chip 8 is also fastened on the button-sized battery 6. A conductive glue 80, such as silver paste, is applied between the button-sized battery 6 and a positive electrode of the LED chip 8 to electrically connect the positive electrode of the LED chip 8 to the positive electrode of the button-sized battery 6. A negative electrode-of the conductive wire 81 is electrically connected to the circuit board 7. The LED chip 8 and the conductive wire 81 are encapsulated within a transparent molding material 82 to protect the LED chip 8 and the conductive wire 81 from being oxidized.

The contact switch 9 is a vibration type switch in this embodiment. One terminal of the contact switch 9 is bonded and electrically connected to the circuit board 7 by soldering. The other terminal of the contact switch 9 is bonded and electrically connected to the negative electrode of the button-sized battery 6 by soldering.

The LED illumination structure of the invention can be applied to a wide variety of ornaments such as earrings, bun, hairpins or garment buttons. For example, when the user wears the earrings having the LED illumination structure mounted therein, discontinuous electrical connection between the positive and negative electrodes of the contact switch 9 allows flashing of the LED illumination structure.

The LED chip 8 drives the illumination structure to emit a bright light, while the heat generated during illumination is dissipated through a metallic surface of the button-sized battery 6 to stabilize the high-brightness characteristic of the LED illumination structure. A positive electrode of the LED chip 8 is directly attached to the button-sized battery 6. A negative electrode of the LED chip 8 is electrically connected to the neighboring circuit board 7 via the conductive wire 81. Thereafter, a molding process is performed. The LED illumination structure of the invention therefore can be easily mass produced with a reduced production cost. Furthermore, the connection configuration of the LED chip reduces the size of the LED illumination structure. The LED illumination structure having a reduced size therefore may be used in a wider variety of ornaments. Since the components of the LED illumination structure are inexpensive, the LED illumination structure therefore may be also used as disposable components.

As described above, the LED illumination structure of the invention has the following advantages:

1. The LED chip drives the illumination structure to emit a very bright light. The connection configuration of the LED chip further reduces the size of the LED illumination structure, which therefore renders the use of the LED illumination structure advantageous in various applications.
2. The LED chip is attached on and electrically connected to the positive electrode of the button-sized battery and dissipates the heat through the metallic surface thereof.
3. The positive and negative electrodes of the LED chip are respectively electrically connected to the button-sized battery and the circuit board, and then are encapsulated within the transparent molding material. The LED illumination structure of the invention therefore is easily mass produced with a reduced production cost.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A light emitting diode (LED) illumination structure, comprising:
   a button-sized battery;
   a circuit board, attached on the button-sized battery;
   an LED chip, attached on the button-sized battery, wherein a positive electrode of the LED chip is electrically connected to a positive electrode of the button-sized battery, and a negative electrode of the LED chip is electrically connected to the circuit board via a conductive wire, a transparent molding material encapsulating the LED chip and the conductive wire; and
   a contact switch, having one terminal electrically connected to the circuit board and another terminal electrically connected to a negative electrode of the button-sized battery.

2. The structure of claim 1, wherein the button-sized battery is a silver oxide battery.

3. The structure of claim 1, wherein the button-sized battery is an alkaline battery.

4. The structure of claim 1, wherein the button-sized battery is a lithium battery.

5. The structure of claim 1, wherein the circuit board is attached to a positive electrode of the button-sized battery.

6. The structure of claim 1, wherein the contact switch is a vibration type switch.

7. The structure of claim 1, wherein a conductive paste is applied between the positive electrode of the LED chip and the button-sized battery.

8. The structure of claim 7, wherein the conductive paste is a silver paste.

* * * * *